United States Patent [19]
Gulczynski

[11] Patent Number: 5,252,974
[45] Date of Patent: Oct. 12, 1993

[54] ENCODER WITH ERROR CORRECTION PARTICULARLY FOR FLASH ANALOG-TO-DIGITAL CONVERTERS

[76] Inventor: Zdzislaw Gulczynski, P.O. Box 11633, Costa Mesa, Calif. 92627

[21] Appl. No.: 225,240

[22] Filed: Jul. 28, 1988

Related U.S. Application Data

[63] Continuation-in-part of Ser. No. 946,598, Dec. 24, 1986, abandoned.

[51] Int. Cl.⁵ .................................... H03M 13/00
[52] U.S. Cl. ................................ 341/141; 341/94; 341/155
[58] Field of Search ............... 341/141, 120, 96, 144, 341/118, 122, 158, 159, 160, 95, 94; 371/30

[56] References Cited

U.S. PATENT DOCUMENTS 4,502,036 2/1985 Furukawa ............................ 341/95
4,733,220 3/1988 Knierim ............................. 341/160
4,763,106 8/1988 Gulczynski ........................ 341/141
4,774,498 9/1988 Traa .................................. 341/159

Primary Examiner—William M. Shoop, Jr.
Assistant Examiner—Brian K. Young

[57] ABSTRACT

The encoder is particularly for high speed and high resolution flash analog-to-digital converters. The number of components is drastically reduced, error correction scheme extended, the conversion speed and reliability increased. A suitable error correction can be accomplished by changing content of the decoders. The encoder comprises a register for sampling and interim storage of the input code, and providing a plurality of section codes, a plurality of section decoders for converting the section codes into a first portion of the output code, and a selective circuit for selecting one of the section codes in response to the first portion of the output code and converting the selected section code into a section portion of the output code.

8 Claims, 2 Drawing Sheets

ENCODER WITH ERROR CORRECTION PARTICULARLY FOR FLASH ANALOG-TO-DIGITAL CONVERTERS

CROSS REFERENCE TO RELATED INVENTIONS

This application is a continuation-in-part of prior application Ser. No. 946,598 filed on Dec. 24, 1986, now abandoned.

BACKGROUND OF THE INVENTION

The invention relates to an encoder particularly for high speed and high resolution flash analog-to-digital converters (ADC).

Two parts can be distinguished in every flash ADC: an analog and digital sections. The analog section of conventional N-bit flash ADCs consists of a reference source, chain of $2^N-1$ resistors and the same number of comparators. The digital section consists of an encoder for sampling comparator output signals, correcting faulty codes and providing binary output code.

The digital output code from the analog section of a flash ADC provided by comparators is referred to as thermometer code since only one pair of adjacent bits is 0 and 1. The code must be sampled and stored as it is unstable due to changes of the ADC input signal, offset voltage of comparators, noise, etc.

The huge number of the comparators in high resolution flash ADCs results in a very complex gate structure of the encoders. Certain kinds of errors caused by a false response of the comparators are not possible to correct due to technological limitations. Simplified error correction schemes result in missing codes. For instance, the flash ADCs have a tendency to miss a code every few billion conversions, i.e. several times a minute when an ADC is sampling at 100MHz.

SUMMARY OF THE INVENTION

The invention is intended to provide an encoder for a high speed and high resolution flash ADC. With reference to prior art, the number of components is drastically reduced, error correction scheme extended, the conversion speed and reliability increased. Generally, the comparator code applied to the encoder is divided in section codes for most efficient processing. A suitable error correction can be accomplished by changing content of the decoders.

Decoder is a device for converting input code into output code, without interim storage. Specific types of decoders are available. However, programmable logic devices, gate arrays, read only memories (ROMs), etc. may be used. These devices also allow an experimentation so that a suitable error correction scheme can be determined for any type and configuration of the flash ADC.

The encoder according to the invention converts input code into output code and comprises a register means for sampling and interim storage of the input code, and providing a plurality of section codes, a plurality of section decoders for converting the section codes into a first portion of the output code, and selective means for selecting one of the section codes in response to the first portion of the output code and converting the selected section code into a second portion of the output code.

In one embodiment the selective means includes a multiplexer means for selecting one of the section codes, and an offset decoder for converting the section code selected by the multiplexer means into the second portion of the output code.

In another embodiment the selective means includes a plurality of offset decoders for separately converting the section codes into offset codes, and a multiplexer means for selecting one of the offset codes and providing the second portion of the output code.

BRIEF DESCRIPTION OF THE DRAWINGS

The present invention will become more clear in conjunction with the accompanying FIGURES of which.

DETAILED DESCRIPTION OF THE INVENTION

Figure 1:
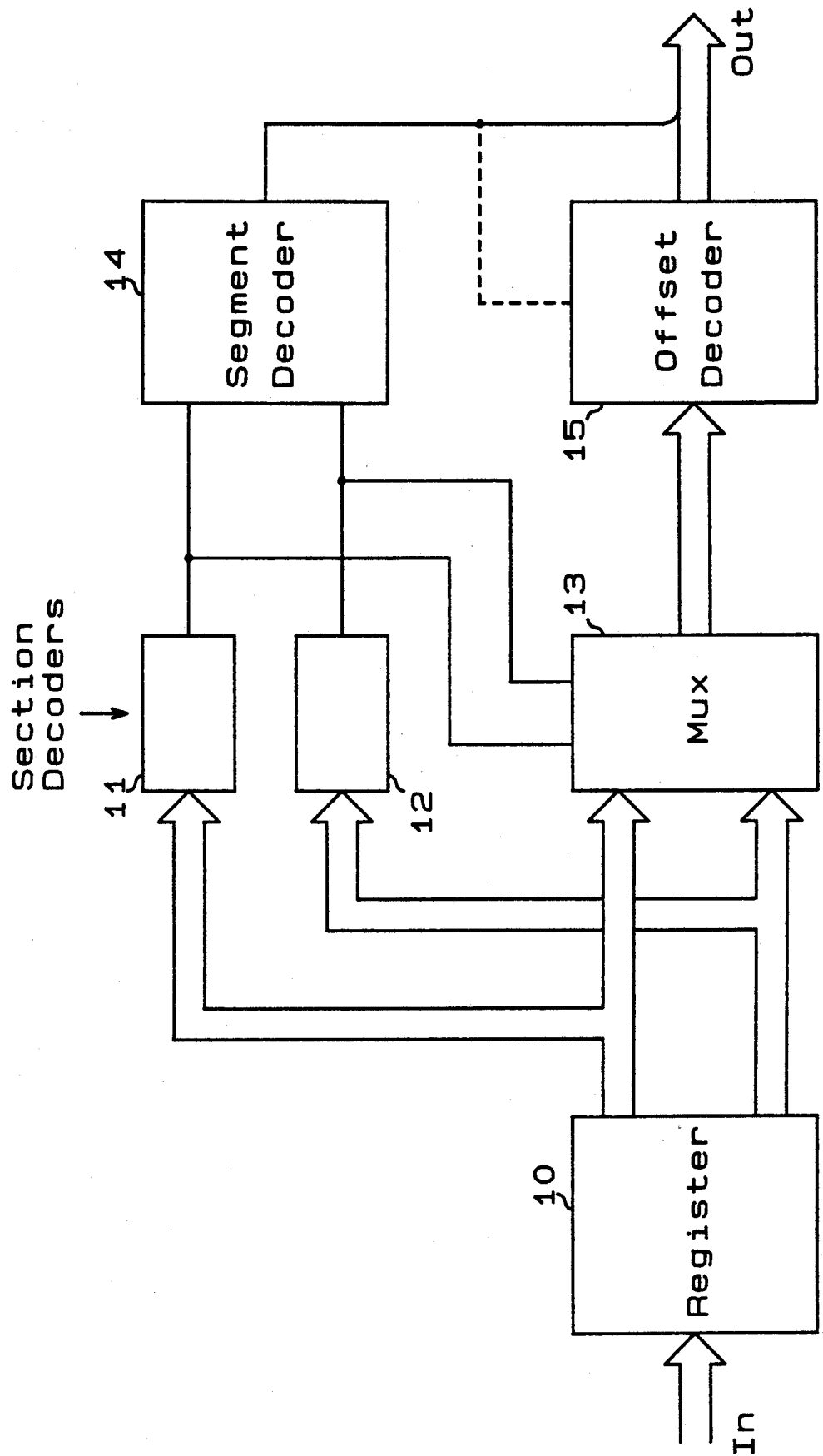
FIG. 1 is an embodiment of the encoder with decoding after multiplexing.

FIG. 1 is an embodiment of the encoder with decoding after multiplexing. The register 10 samples and stores the thermometer code and provides a plurality of section codes, wherein two are considered for simplicity. Each section code is a group of bits adjacent to or overlapping bits of another section code. The length and number of section codes can be determined by the user. For instance, a 15 bit register 10 has 15 inputs, 15 outputs and may provide 8 and 7 bit adjacent section codes. Only the register 10 requires a timing signal for the interim storage, wherein an ordinary register comprising single flip-flop cells can be employed.

The section decoders 11 and 12 separately receive the section codes and accordingly give a selection priority thereto. Specifically, the section decoders 11 and 12 assign one bit to respectively most and least significant bits (MSBs and LSBs respectively) of the encoder input code stored in the register 10. The section decoder 11 is an OR gate and returns 0 only if all MSBs are 0. The section decoder 12 is a NAND gate and returns 0 only if all LSBs are 1. The thermometer code contains only one 0-1 bit break and thereby at least one decoder 11 or 12 outputs 0 so that the priority of the section codes can be established.

The multiplexer 13 has two data inputs each receiving the respective section code from the register 10. In response to a select code, the multiplexer 13 outputs only one section code. The segment decoder 14 converts the code provided by the section decoders 11 and 12 into MSBs of the encoder output code. The MSBs or, as shown, the code provided by the section decoders 11 and 12 may be used as select code for the multiplexer 13. The offset decoder 15 converts the selected section code into LSBs of the encoder output code. A portion of the MSBs can be applied to the offset decoder 15 as shown in FIG. 1. In such a way nonlinearities of an amplifier driving the ADC, offset voltage of individual comparators, etc. can be considered.

· Generally, the section decoders 11 and 12 convert the section codes into a first portion of the output code. The multiplexer 13 and offset decoder 15 constitute a selective means for selecting one of the section codes in response to the first portion of the output code and converting the selected section code into a second portion of the output code. Therefore, the segment decoder 14 is optional. The content of the decoders 11, 12, 14 and 15 can be predetermined, whereby the advantage over the prior art is the drastically reduced number of components. Moreover, a complete error correction can be accomplished in accordance with any user's requirements. Obviously, the content of the decoders will depend on the bit number of the input code, type of the segmentation chosen by the user, etc.

An example of an encoder for a 4-bit flash ADC is shown. The comparator section thereof provides a 15-bit thermometer code, e.g. 00000000 0011111. For simplicity, the register 10 provides two adjacent section codes. The number of input and output terminals of the components is equal to the respective numbers of bits, wherein the connections carrying one and plurality of bits are marked as signal lines and data buses respectively. In particular, the multiplexer 13 has 8 and 7 bit data inputs, two 1 bit select inputs and 8 bit output.

|  | input | output |
|---|---|---|
| Register 10 | 00000000 0011111 | same |
| Decoder 11 | 00000000 | 0 |
| Decoder 12 | 0011111 | 1 |
| Decoder 14 | 01 | 0 |
| Mux 13 | 00000000 0011111 | 00011111 |
| Decoder 15 | 00011111 | 101 |

In the above example, the segment decoder 14 and offset decoder 15 provide respectively the MSB and LSBs of the encoder output code. The output code is equal 0101 which is the binary representation of the 15-bit thermometer code.

Figure 2:
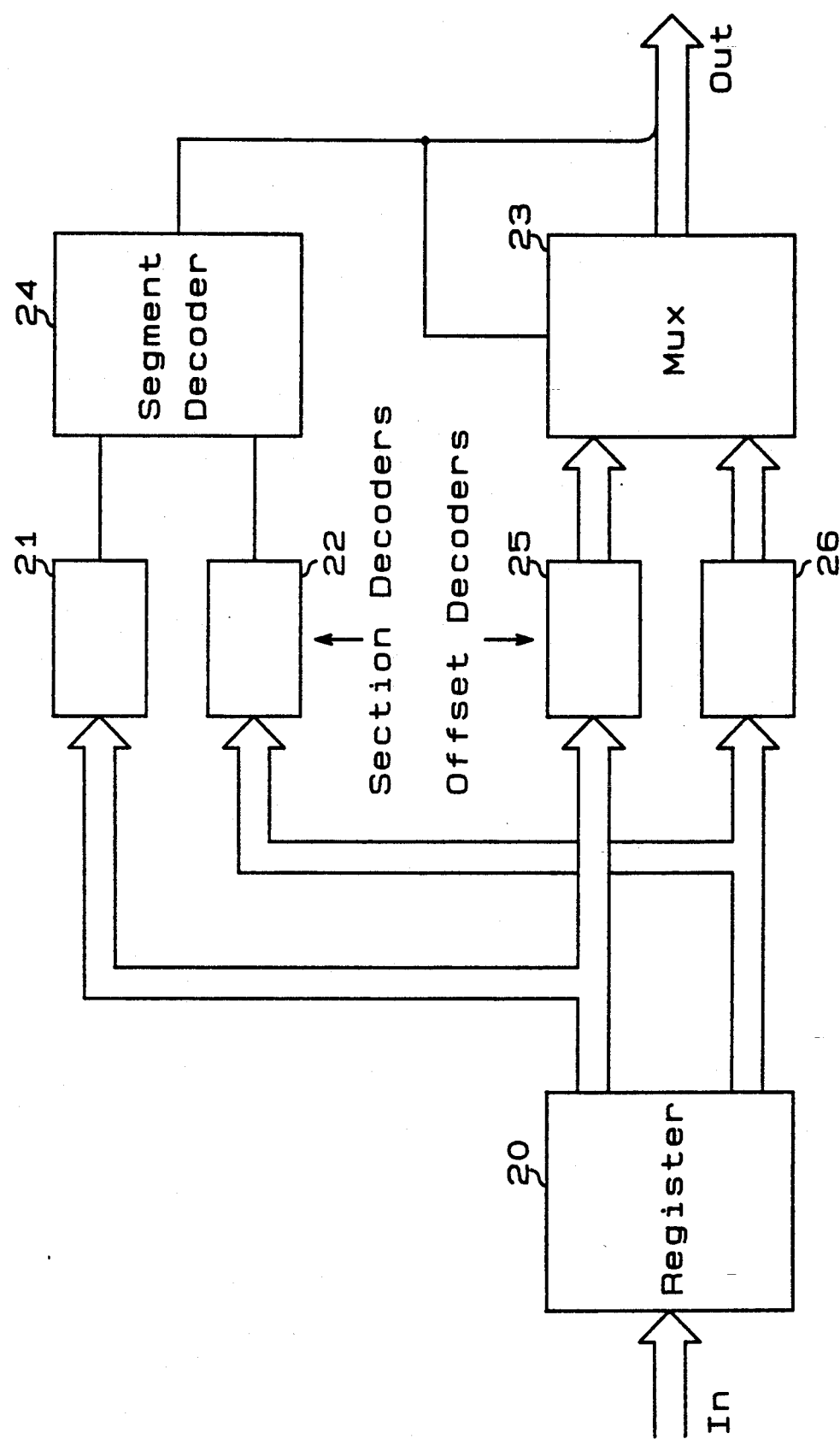
FIG. 2 is the preferred embodiment of the encoder with decoding prior to multiplexing.

FIG. 2 is the preferred embodiment of the encoder with decoding prior to multiplexing. An individual conversion of the segment codes is desirable for a higher accuracy of the ADC. In such a way nonlinearities of an amplifier driving the ADC, offset voltage of individual comparators, etc. can be considered. The comparator code is applied to the register 20. The section codes thereof are separately applied to the section decoders 21, 22 and also offset decoders 25, 26. The offset decoders 25 and 26 have a smaller number of outputs than inputs so that the multiplexer 23 coupled thereto is less complex than the multiplexer 13 of FIG. 1. The code provided by the section decoders 21 and 22 is applied to the segment decoder 24.

The offset decoders 25 and 26 separately convert the section codes into offset codes. The multiplexer 23 has at least two data inputs each receiving the respective offset code. In response to a select code, the multiplexer 23 outputs only one offset code. The segment decoder 24 converts the code provided by the section decoders 21 and 22 into MSBs of the encoder output code. The code provided by the section decoders 21 and 22 or, as shown, MSBs may be used as select code for the multiplexer 23. One of the offset decoders 25 or 26 provides the offset code which has the value of LSBs of the encoder output code, the output of the other decoder is of no consequence.

Generally, the section decoders 21 and 22 convert the section codes into a fist portion of the output code. The multiplexer 23 and offset decoders 25, 26 constitute a selective means for selecting one of the section codes in response to the first portion of the output code and converting the selected section code into a second portion of the output code. Therefore, the segment decoder 24 is optional. The section decoders 21 and 22 separately receive the section codes and accordingly give the selection priority thereto. Specifically, the section decoders 21 and 22 assign one bit to respectively MSBs and LSBs of the encoder input code stored in the register 20. The section decoders 21 and 22 may be an OR and NAND gates respectively, similarly to 11 and 12 of FIG. 1.

An example of encoding of the 15-bit thermometer code 00000000 0011111 is shown. The multiplexer 23 has two 3 bit data inputs, 1 bit select input and 3 bit output. The segment decoder 24 and multiplexer 23 provide respectively the MSB and LSB s of the encoder output code. The encoder output code is equal 0101 and is the same as in above numerical example.

|  | input | output |
|---|---|---|
| Register 20 | 00000000 0011111 | same |
| Decoder 21 | 00000000 | 0 |
| Decoder 22 | 0011111 | 1 |
| Decoder 24 | 01 | 0 |
| Decoder 25 | 00000000 | 000 |
| Decoder 26 | 0011111 | 101 |
| Mux 23 | 000 101 | 101 |

The termometer code is anomalous if a response of one or more comparators is false. The anomalous code is detected by the section decoders 21 and 22. An obvious example of determining an anomalous code would be detection of 1s which are not adjacent. The section priority of the section codes is determined by the segment decoder 24 which provides the select code to the multiplexer 23 and MSBs of the encoder output code. An anomaly of the thermometer code within one section code is corrected by the offset decoders 25 and 26.

Generally, all but the uppermost section decoder provide warning bits indicating possible errors. In the FIG. 2 embodiment, the section decoder 22 provides a warning bit which is received by the segment decoder 24 to establish an adequate selection priority. In the following example, the anomaly occurs in one section code. However, it interferes with the other section code and is thus corrected by the segment decoder 24 setting the selection priority. An example of the thermometer code 00000000 0011111 is chosen in conformity with above numerical examples.

|  | Thermometer code: | |
|---|---|---|
|  | Ideal | Anomalous |
| Register 20 out | 00000000 0011111 | 00000001 0011111 |
| Decoder 21 out | 0 | 1 |
| Decoder 22 out | 1 1 | 1 1 |
| Decoder 24 out | 0 | 0 |
| Decoder 25 out | 000 | 000 |
| Decoder 26 out | 101 | 101 |
| Mux 23 out | 101 | 101 |

The section decoder 22 provides a warning bit indicating that at least one uppermost bit of the respective section code is equal 1. The warning bit is considered by the segment decoder 24 only if both section decoders 21 and 22 give the selection priority, i.e. in case of the anomalous thermometer code with interfering section codes. The segment decoder 24 and multiplexer 23 provide respectively the MSB and LSBs of the encoder output code. The multiplexer 23 selects output of the offset decoder 25 is of no consequence. The encoder output code is equal 0101 and is the same as in above numerical examples.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Encoder for converting input code into output code, comprising:
    a register means for sampling and interim storage of the input code, and providing a plurality of section codes;
    a plurality of section decoders for converting the section codes into a first portion of the output code; and
    a selective means for selecting one of the section codes in response to the first portion of the output code and converting the selected section code into a second portion of the output code.

2. Encoder of claim 1 further including a segment decoder for converting the code provided by the section decoders into the first portion of the output code.

3. Encoder of claim 1 further including a segment decoder for converting the code provided by the section decoders into the first portion of the output code, wherein the selective means is responsive to the code provided by the section decoders.

4. Encoder of claim 1 wherein the selective means includes:
    a multiplexer means for selecting one of the section codes; and
    an offset decoder for converting the section code selected by the multiplexer means into the second portion of the output code.

5. Encoder of claim 4 wherein the offset decoder converts the section code selected by the multiplexer means and a portion of the first portion of the output code into the second portion of the output code.

6. Encoder of claim 1 wherein the selective means includes:
    a plurality of offset decoders for separately converting the section codes into offset codes; and
    a multiplexer means for selecting one of the offset codes and providing the second portion of the output code.

7. Encoder for converting input code into output code, comprising:
    a register means for sampling and interim storage of the input code, and providing a plurality of section codes;
    a plurality of section decoders for converting the section codes into a first portion of the output code;
    a plurality of offset decoders for separately converting the section codes into offset codes; and
    a multiplexer means for selecting one of the offset codes in response to the first portion of the output code and providing a second portion of the output code.

8. Encoder of claim 7 further including a segment decoder for converting the code provided by the section decoders into the first portion of the output code.

* * * * *